United States Patent
Peussa et al.

(10) Patent No.: US 11,685,644 B2
(45) Date of Patent: Jun. 27, 2023

(54) MICROELECTROMECHANICAL DEVICE WITH STOPPER

(71) Applicant: MURATA MANUFACTURING CO., LTD., Nagaokakyo (JP)

(72) Inventors: Marko Peussa, Espoo (FI); Pasi Kivinen, Kirkkonummi (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/124,988

(22) Filed: Dec. 17, 2020

(65) Prior Publication Data

US 2021/0188621 A1    Jun. 24, 2021

(30) Foreign Application Priority Data

Dec. 18, 2019   (FI) ..................................... 20196091

(51) Int. Cl.
    *G01P 15/125*    (2006.01)
    *G01P 15/08*    (2006.01)
    *B81B 3/00*    (2006.01)

(52) U.S. Cl.
CPC ........ *B81B 3/0051* (2013.01); *G01P 15/0802* (2013.01); *G01P 15/125* (2013.01); *B81B 2201/0235* (2013.01); *G01P 2015/0871* (2013.01)

(58) Field of Classification Search
CPC .............................................. G01P 2015/0874
See application file for complete search history.

(56) References Cited

U.S. PATENT DOCUMENTS

| | | | |
|---|---|---|---|
| 2004/0183149 A1 | 9/2004 | Schenk | |
| 2007/0029629 A1* | 2/2007 | Yazdi | G01P 1/023 257/414 |
| 2009/0031809 A1* | 2/2009 | Lin | G01P 15/125 73/514.32 |
| 2011/0043960 A1 | 2/2011 | Ikehashi | |
| 2014/0345380 A1* | 11/2014 | Jia | B81C 1/00968 73/514.32 |
| 2015/0013458 A1 | 1/2015 | Tanaka | |
| 2016/0091524 A1* | 3/2016 | Kamada | B81B 3/0086 73/514.32 |
| 2016/0099112 A1 | 4/2016 | Dereus et al. | |
| 2018/0238929 A1* | 8/2018 | Isobe | G01P 15/097 |
| 2019/0063924 A1 | 2/2019 | Tanaka | |

FOREIGN PATENT DOCUMENTS

WO    WO 2018/154196 A1    8/2018

OTHER PUBLICATIONS

European Search Report dated May 11, 2021 corresponding to European Patent Application No. 20208253.
Finnish Search Report dated Aug. 18, 2020 corresponding to Finnish Patent Application No. 20196091.

* cited by examiner

*Primary Examiner* — Stephen D Meier
*Assistant Examiner* — Ruben C Parco, Jr.
(74) *Attorney, Agent, or Firm* — Squire Patton Boggs (US) LLP (57) ABSTRACT

This disclosure describes a microelectromechanical device comprising at least one mobile rotor. The rotor comprises a rotor measurement region and a rotor stopper region and a rotor isolation region which connects the rotor measurement region mechanically to the rotor stopper region and isolates the rotor measurement region electrically from the rotor stopper region.

2 Claims, 8 Drawing Sheets

MICROELECTROMECHANICAL DEVICE WITH STOPPER

FIELD OF THE DISCLOSURE

This disclosure relates to microelectromechanical (MEMS) devices, and more particularly to MEMS devices with mobile structures. The present disclosure further concerns stopper structures.

BACKGROUND OF THE DISCLOSURE

Many microelectromechanical devices, such as accelerometers and gyroscopes, comprise a moving part, which may be called a rotor. The rotor may in some applications be called a proof mass, a Coriolis mass, or a mass element. The rotor is typically attached with a flexible attachment structure to an adjacent stationary part, which may be called a stator. The rotor may have been formed by etching a device substrate, and the stator may, for example, be the fixed part of the device substrate which surrounds the rotor. Alternatively, the stator may be a part of another mechanical structure which lies adjacent to the device substrate, such as a cover. The stator remains fixed in relation to the surrounding parts of the MEMS chip, while the rotor can undergo motion in relation the chip.

The motion of the rotor is typically measured (and in the case of gyroscopes, also actuated) with electrical transducers. These transducers may for example be capacitive transducers with two opposing electrode structures, one on the stator and the other on the rotor. The electrode structures may comprise conductive layers deposited on the rotor and/or the stator. Alternatively, if the material of the substrate is an at least moderately conductive material such as silicon, a capacitive electrode on the rotor (which may be called the rotor electrode) may be formed simply by connecting the entire rotor to a certain electric potential. Compared to an approach where a conductive layer is deposited to form the rotor electrode, the benefit of setting the entire rotor to the electric potential required at the rotor electrode has the advantage that no high-conductivity electrical wiring dedicated for the rotor electrode needs to be built across the rotor.

Document US2019063924 discloses a MEMS accelerometer where a silicon rotor is set to a certain potential to form capacitive transducers with adjacent stator electrodes. Certain constraints are inevitable in an arrangement where the entire rotor is set to a given potential. The voltages that applied to each transducer may have to be restricted due to the voltage requirements of other transducers formed in the same rotor, and physical contact between stopper structures on the rotor and stator may create electrical disturbances in the transducer measurements due to the sudden electrical changes that contact between the rotor and the stator can generate if the rotor and stator are at different potentials.

Document US2004183149 discloses a rotor with two electrically separated regions. The rotational motion of the rotor is configured to be actuated or measured by adjacent electrodes coupled to these regions. However, the rotor is separated into two electrically separated regions to allow the use of only one stator electrode for actuating or measuring the rotational motion. The measurement is still easily disturbed if a stopper is implemented.

BRIEF DESCRIPTION OF THE DISCLOSURE

An object of the present disclosure is to provide an apparatus for solving the above problems.

The object of the disclosure is achieved by an arrangement which is characterized by what is stated in the independent claims. The preferred embodiments of the disclosure are disclosed in the dependent claims.

The disclosure is based on the idea of forming two or more electrically separated regions in a rotor and building a stopper structure where the electric potential of the rotor and stator is equal. This facilitates new improvements in measurement accuracy and device reliability.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

This disclosure describes a microelectromechanical device comprising a mobile rotor which comprises a first rotor measurement region made of silicon and a rotor stopper region made of silicon, and a fixed stator which is adjacent to the rotor and comprises a first stator measurement region and a stator stopper region. The rotor stopper region is separated from the stator stopper region by a stopper gap. The rotor also comprises a first rotor isolation region made of an insulating material which connects the first rotor measurement region mechanically to the rotor stopper region and isolates the first rotor measurement region electrically from the rotor stopper region.

The rotor stopper region and stator stopper region may be set to the same electric potential. The mobile rotor may be configured to undergo movement in a first direction in normal operation, and this movement may close the stopper gap. Alternatively, the mobile rotor may not be deliberately configured to undergo movement in the first direction in normal operation, but there may nevertheless be a risk that the rotor will move in the first direction if the device is exposed to a sudden external shock. A stopper structure may be needed in both of these scenarios, and stoppers may be implemented for both of these scenarios in the same device.

In this disclosure, the term "rotor" refers to a mobile part in a device layer. The device layer may be a silicon wafer where micromechanical structures have been formed by etching and coating techniques. The rotor may be a body which is configured to undergo translational and/or rotational movement as a rigid body. Any bending or twisting that takes place in the rotor may be small in comparison to the magnitude of the translational and/or rotational movement.

In this disclosure the plane which is defined by the device wafer is referred to as the device plane and illustrated as the xy-plane. The term "horizontal" refers to dimensions parallel to this plane. Movement in the device plane may be called "in-plane" movement, while movement away from the device plane may be called "out-of-plane" movement.

The term "vertical" refers to the direction which is perpendicular to the horizontal device plane and is indicated as the z-axis in the figures. The terms "above" and "below" refer to differences in z-coordinates. Terms such as "height" and "depth" refer to vertical distances (in the z-direction), while "width" and "length" refer to horizontal distances (in either the x-direction or the y-direction). The term "volume" refers to a three-dimensional region in the xyz-space.

Terms such as "vertical" or "horizontal" do not imply anything about the orientation of the silicon wafer when the MEMS device is manufactured, or when the device is in use. The device and the silicon wafer may be oriented in any suitable direction during usage or manufacturing, for example sideways in such a manner that a plane which is in this disclosure referred to as "horizontal" becomes a vertical plane. In other words, the terms "horizontal" and "vertical" merely define two orthogonal directions, one of which is parallel to the surface of the device wafer, and the other normal to that surface.

The rotor is configured to undergo movement when the device is in use. This movement may be either linear translational or angular rotation, or it may be combination of translation and rotation. The movement may be induced by external forces, for example when the MEMS device undergoes acceleration or angular rotation. The movement may alternatively be actuated by capacitive force transducers connected to the rotor.

The rotor itself may form a part of one or more capacitive force transducers. These force transducers may for example include a capacitive transducer which comprise one or more rotor electrodes on the rotor and one or more stator electrodes on a stator, so that each stator electrode is adjacent to a corresponding rotor electrode. Each electrode may comprise multiple parallel and elongated fingers, and the fingers of a rotor electrode may be interdigitated with the fingers of a corresponding stator electrode to increase the capacitance of the capacitive transducer. The rotor electrodes and stator electrodes may alternatively comprise just one rotor electrode plate paired with one stator electrode plate for a parallel-plate measurement.

The term "stator" may refer either to immobile parts of the device wafer (that is, parts which can for all practical purposes be considered fixed in the relation to the surrounding device package) or to other fixed structures adjacent to the device wafer, such as a part of the wall of the enclosure or the package where the device wafer is enclosed.

The rotor may be suspended by springs from a fixed structure, for example from one or more anchor points located on the stator. This fixed structure may therefore be a part of the device wafer itself, and the springs may be formed in the device wafer in the same etching process where the rotor is formed. The springs may be bars or beams with at least one sufficiently thin dimension to allow the spring to undergo flexible deformation. This flexible deformation allows the rotor to move. The movement of the rotor may be oscillation, and in this case the spring constant of the suspension springs is one determinant of the oscillation amplitude. The springs may also be called suspenders.

Each rotor measurement region and rotor isolation region described in this disclosure is a three-dimensional volume. These regions may be formed by etching one or more trenches in a rotor and then filling these trenches with an electrically isolating material, as described in more detail below. The rotor then retains its structural integrity but is separated into two or more volumes that are electrically isolated from each other.

Figure 1A:
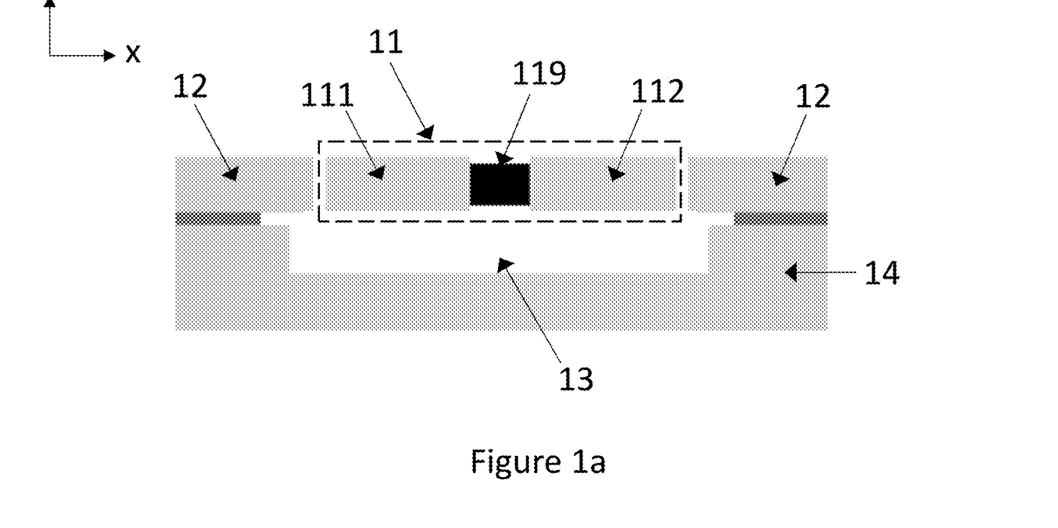
FIGS. 1a and 1b illustrate a MEMS device with a rotor.

FIG. 1a illustrates a MEMS device with a rotor 11. The rotor 11 has been encircled with a dotted line. The rotor 11 comprises a rotor measurement region 111, a rotor stopper region 112, and a first rotor isolation region 119 which connects the rotor measurement region 111 mechanically to the rotor stopper region 112 and isolates these two regions electrically from each other. The rotor is flanked on both sides by stators 12, which form a part of the device wafer where the rotor has been formed. The device wafer is in this case a part of a silicon-on-insulator (SOI) wafer which also comprises a support wafer 14. A cavity 13 has been formed in the support wafer 14 so that it underlies the rotor 11, giving the rotor space for vertical movement. Each rotor region and rotor isolation region is in this case a rotor volume. The material of the device wafer may for example be crystalline silicon or polycrystalline silicon which has been doped sufficiently to exhibit electrical conductivity. The device may be configured to undergo translational motion for example in the y-direction or the z-direction.

Figure 1B:
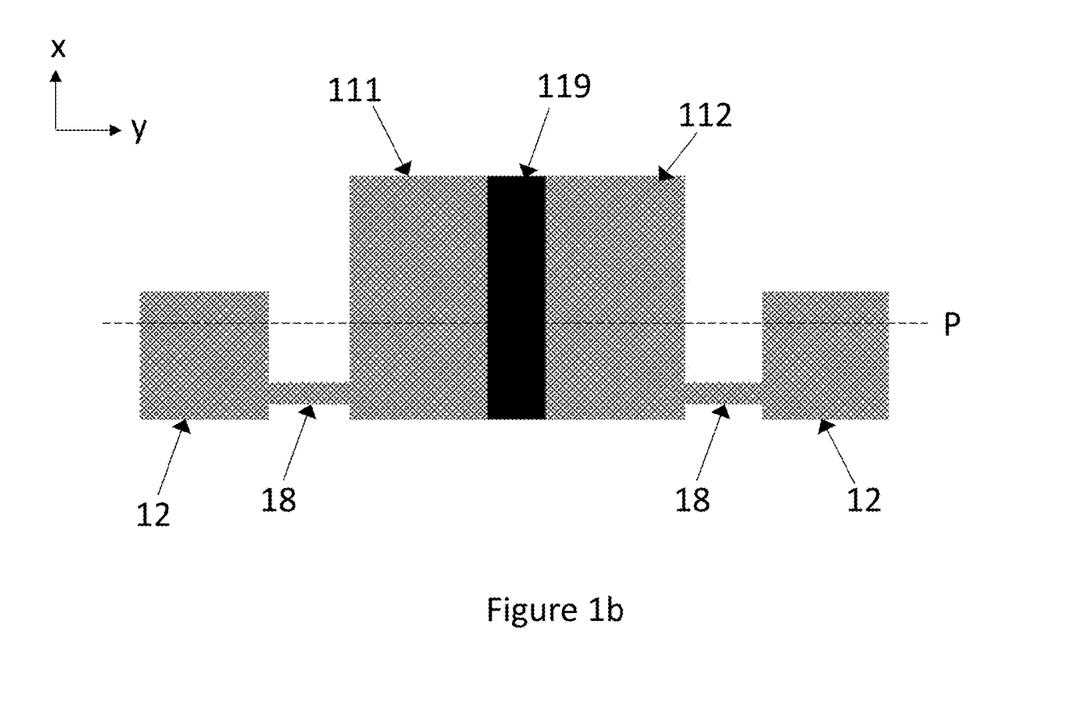

FIG. 1b illustrates one example of how the same rotor could be formed in the xy-plane. The cross-section illustrated in FIG. 1a is a cross-section along the line P in FIG. 1b. FIG. 1b illustrates two flexible suspenders 18 which attach the rotor 11 to the stators 12. Many other device geometries are also possible in the xy-plane.

Figure 2A:
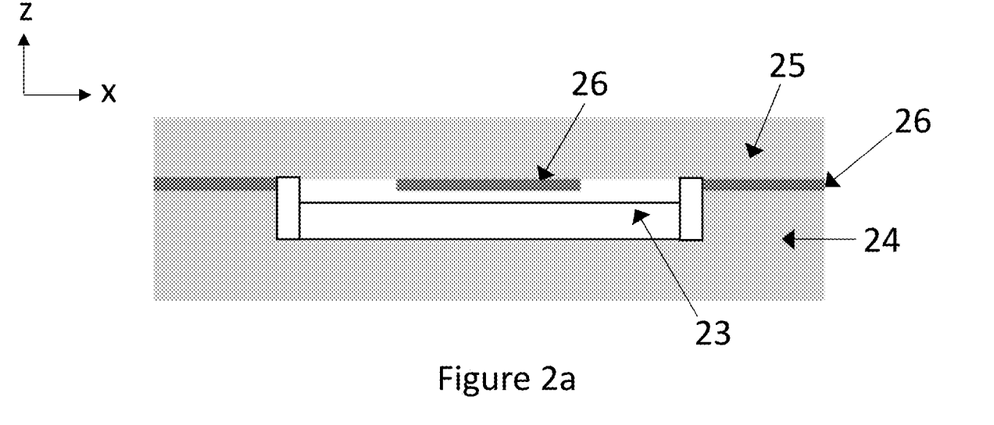
FIGS. 2a-2e illustrate a method for manufacturing a MEMS device

FIGS. 2a-2e illustrate a method for manufacturing the MEMS device shown in FIG. 1a. Reference numbers 21, 211, 212, 219 and 22-24 correspond to reference numbers 11, 111, 112, 119 and 12-14, respectively, in FIG. 1a. FIG. 2a shows a SOI-wafer comprising a device wafer 25 and support wafer 24, joined together with an insulating oxide layer 26. A cavity 23 has been formed in the support wafer 24. The oxide layer 26 has been patterned within the cavity 23, but it may alternatively be unpatterned. The method does not necessarily have to be performed on a cavity-SOI substrate. The substrate can instead be any substrate with a silicon/insulator/silicon structure, for example one where a layer of polycrystalline silicon and an insulating layer surround a crystalline silicon substrate, or a silicon-on-sapphire substrate. The device layer may alternatively be deposited on top of an insulating support wafer, such as an oxidized silicon wafer. If substrates without a cavity are used, the rotor may be released from the underlying wafer in a release etch performed after the rotor has been constructed.

Figure 2B:
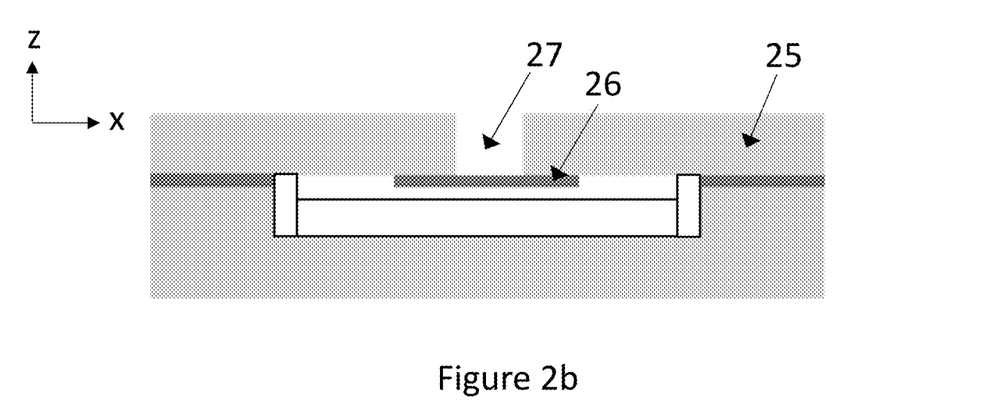

In FIG. 2b, an isolation trench 27 has been formed in the device wafer 25 to define the location of the rotor isolation region. The isolation trench may for example be formed by deep-reactive ion etching (DRIE) or by any plasma etching method. The oxide layer 26 acts as an etch-stop layer.

Figure 2C:
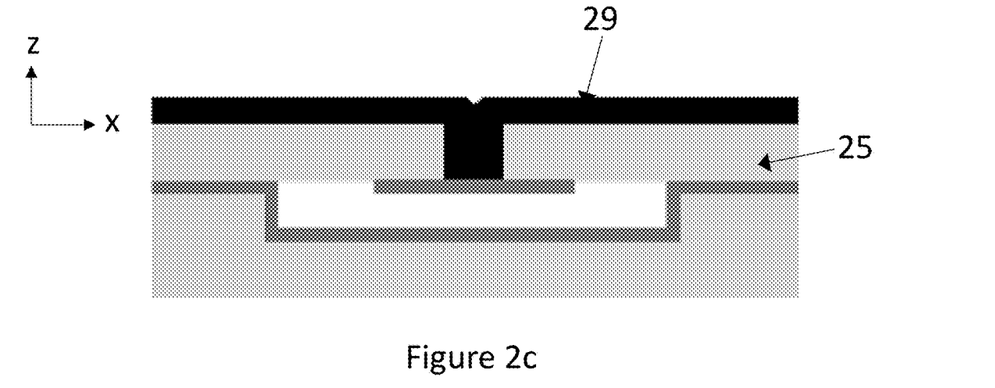

As illustrated in FIG. 2c, a layer of insulating material 29 is then deposited over the device wafer 25. This material may be selected from a broad range of insulating materials, but it should after deposition have sufficient structural integrity to keep the two regions of the rotor tightly attached to each other even as the rotor moves. To ensure this structural integrity, the insulating material 29 may be a material with high conformality, so that the isolation trench 27 can be entirely filled without any voids. If the isolation trench 27 has a high depth/width aspect ratio, for example greater than 10, then the insulating material 29 may for example be deposited by atomic layer deposition (ALD). Other deposition methods may also be used. The optimal width of isolation trench 27 depends on how the rotor regions are designed, Different design options will be discussed below. The sidewalls of the isolation trench 27 do not necessarily have to be vertical.

The insulating material 29 may for example be silicon dioxide, aluminum oxide, silicon nitride or undoped polycrystalline silicon. The insulating material 29 may alternatively be a nitride-carbide, oxide-carbide or nitride-oxide composite of tungsten, tantalum, yttrium, neodymium, cerium, lanthanum, zirconium, indium, niobium, molybdenum or hafnium, or a compound material which comprises two or more of the materials listed above.

In general, the insulating material should be mechanically stiff, have good adhesion to the rotor material and have thermal expansion properties that are compatible with those of the rotor material. It should preferably be possible to deposit the insulating material conformally in narrow trenches and to etch it at least moderately quickly. In any embodiment presented in this disclosure, an additional adhesive layer may be inserted at the interface between a rotor measurement region and an isolation region. This additional adhesive layer does not necessarily have to insulating, it may alternatively be conductive.

The insulating material 29 may be deposited in a chemical vapour deposition process, atomic layer deposition process, or, in the case of silicon dioxide, by thermal oxidation.

Figure 2D:
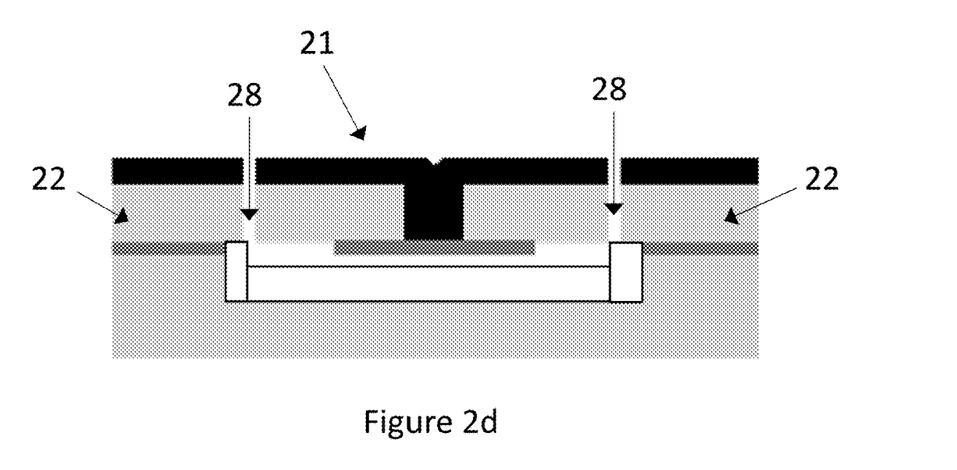

In FIG. 2*d*, release trenches 28 have been etched through the device wafer 25, for example by first patterning a mask on the insulating material 29 and then performing a DRIE etch through the device wafer. The device wafer is thereby divided into stators 22 which remain fully fixed to the surrounding parts of the device, and the rotor 21 which is released from the fixed structures so that it becomes capable of moving, though it is still attached to them with flexible springs (not illustrated).

Figure 2E:
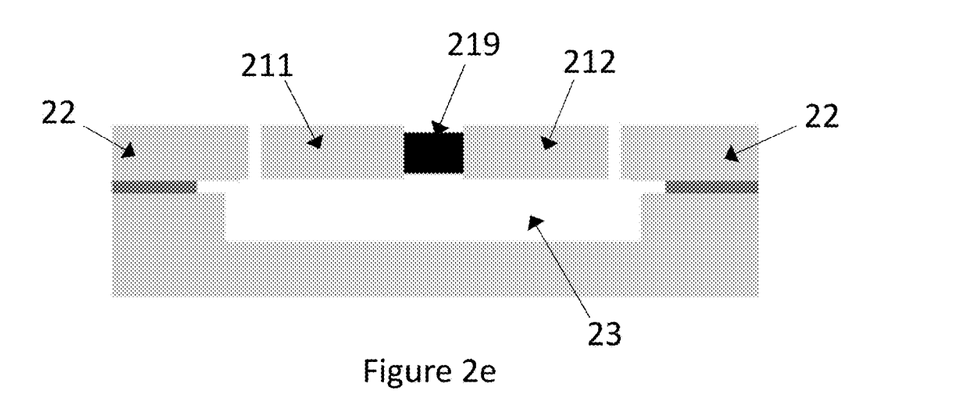

In FIG. 2*e* an oxide etch has been performed to remove excess insulating material from the top of the device wafer, and possibly also from the walls of the cavity 23. The resulting device corresponds to the one presented in FIG. 1*a*, where the rotor comprises a rotor measurement region 211 and a rotor stopper region 212 mechanically connected to each other by a first rotor isolation region 219. If the process would be carried out on a SOI wafer without a pre-built cavity, the final step would involve a release etch below the rotor to release it from the underlying structures.

Figure 3A:
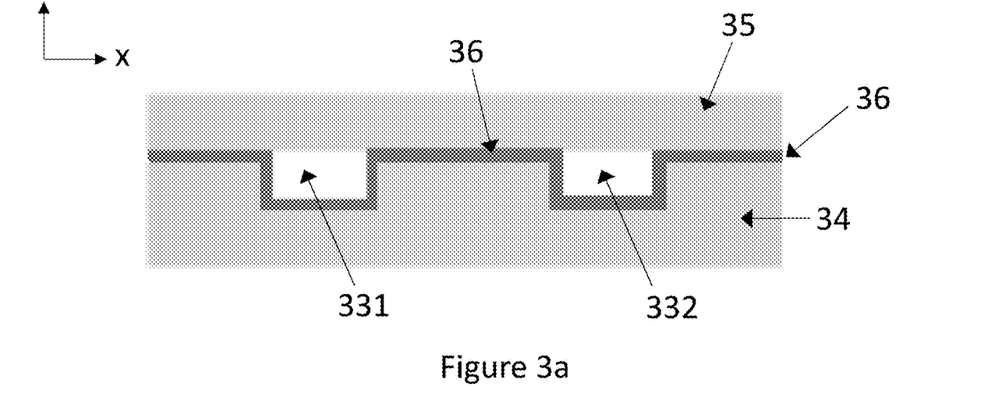
FIGS. 3a-3e illustrate another method for manufacturing a MEMS device.
Figure 3B:
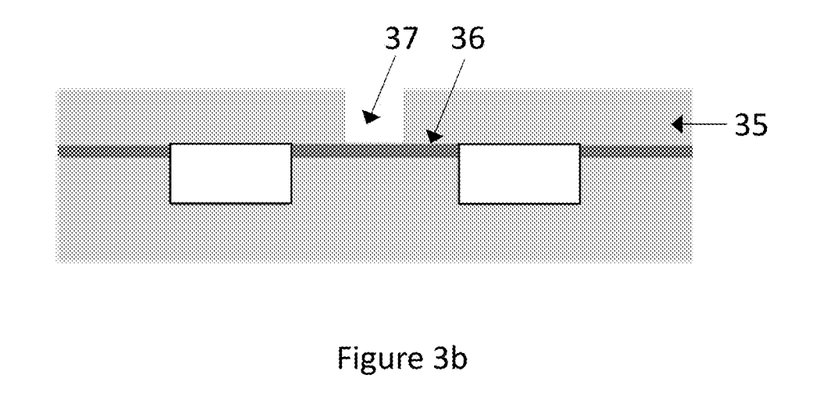
Figure 3C:
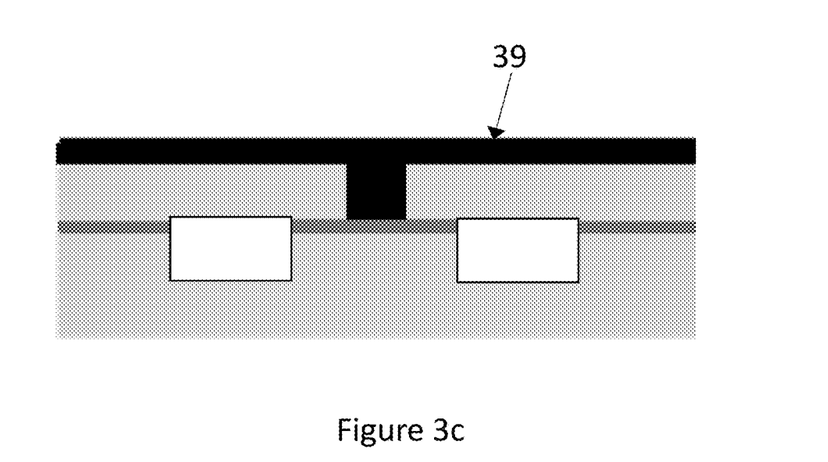
Figure 3D:
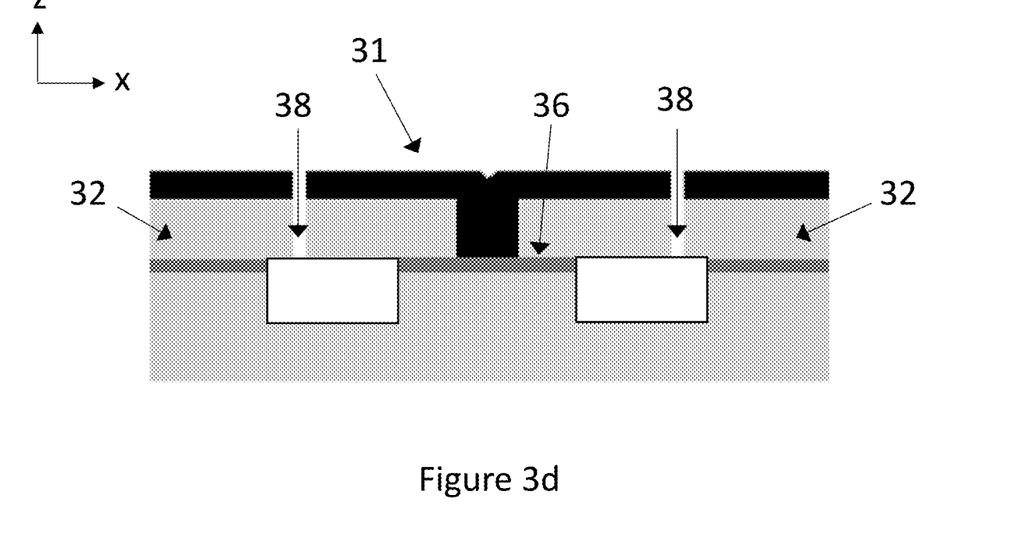
Figure 3E:
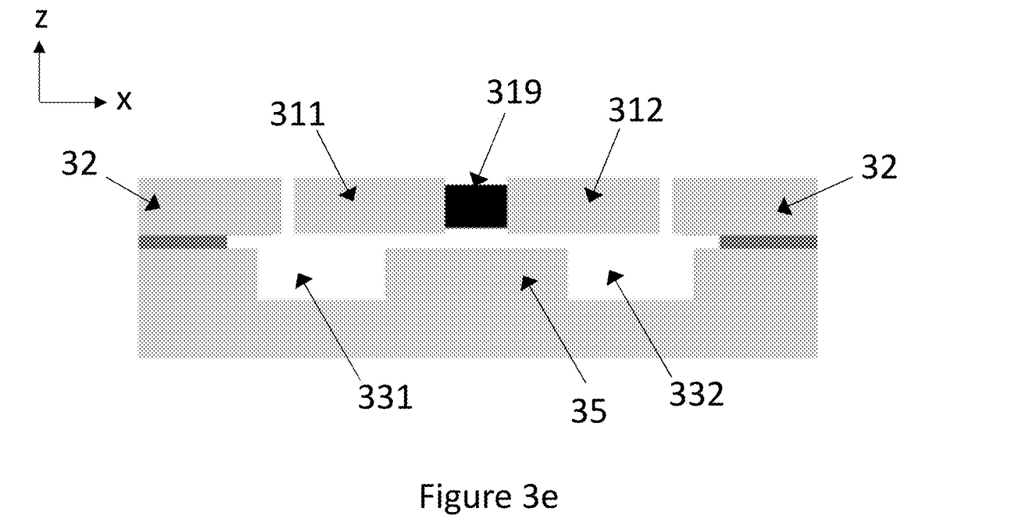

FIGS. 3*a*-3*e* illustrate an alternative method for manufacturing a MEMS device with a rotor divided into two electrically separate regions. In FIG. 3*a* reference numbers 34-36 correspond to reference numbers 24-26 in FIG. 2*a*, but in this case the support wafer 34 has two cavities 331 and 332 instead of one. In FIG. 3*b* reference number 37 corresponds to reference number 27 in FIG. 2*b*, and it can be prepared in the same manner as 27. In FIGS. 3*c*-3*e* reference numbers 39, 31-32, 311-312, 38 and 319 again correspond to reference numbers 29, 21-22, 211-212, 28 and 219 in FIGS. 2*c*-2*e*, and the methods and materials described above can be used for manufacturing them. In FIG. 3*e* the rotor has limited room for movement in the z-direction—only as much as the removal of the oxide layer 36 leaves between the device wafer and the support wafer. This may be useful in applications where vertical stopper structures are needed, and region 35 of the support wafer may in this case form a stator stopper region.

In general, a method for manufacturing a rotor with two or more electrically separated regions may comprises the steps of 1) etching one or more vertical isolation trenches through the device wafer, 2) depositing a layer of insulating material over the device wafer so that it fills the isolation trenches, optionally by atomic layer deposition so that the isolation trenches are filled conformally, 3) releasing the rotor from the fixed parts of the device wafer by etching one or more vertical release trenches through the device wafer, and optionally also etching a release cavity below the rotor to release it from an underlying support wafer. The steps do not necessarily have to be performed in this order. Step 3 could example be performed before steps 1 and 2.

Rotors with Multiple Electrically Isolated Regions

In any embodiment described in this disclosure, the rotor may comprise more than two regions that are electrically isolated from each other. In other words, in addition to the first rotor measurement region and the rotor stopper regions which are separated by a first rotor isolation region, the rotor may comprise a second rotor measurement region made of silicon and a second rotor isolation region made of an insulating material. The second rotor measurement region may be mechanically connected to the first rotor measurement region and/or to the rotor stopper region by the second rotor isolation region. The second rotor isolation region then isolates the second rotor measurement region electrically from the rotor measurement region and the rotor stopper region.

In other words, the mobile rotor may comprise a second rotor measurement region and a second rotor isolation region. The second rotor measurement region may be mechanically connected to the first rotor measurement region and/or to the rotor stopper region by the second rotor isolation region. The second rotor isolation region isolates the second rotor measurement region electrically from the first rotor measurement region and the rotor stopper region.

The methods presented in FIGS. 2*a*-2*e* and 3*a*-3*e* can be directly applied also to the manufacture of rotors with three electrically separated regions. The number of electrically separated regions and stopper regions can of course also be increased further.

The Shape of the Rotor Isolation Region in the Xy-Plane

Many geometries are possible for the rotor isolation region in the xy-plane. FIGS. 4*a*-4*e* illustrate various possible shapes that rotor isolation regions may have in the xy-plane. Selecting the shape may be especially important in the first embodiment described above, since the shape of the rotor isolation region will directly influence the structural integrity of the rotor. The first embodiment will therefore be used as a primary example, but any of the presented shapes can be selected in the second embodiment as well.

Figure 4A:
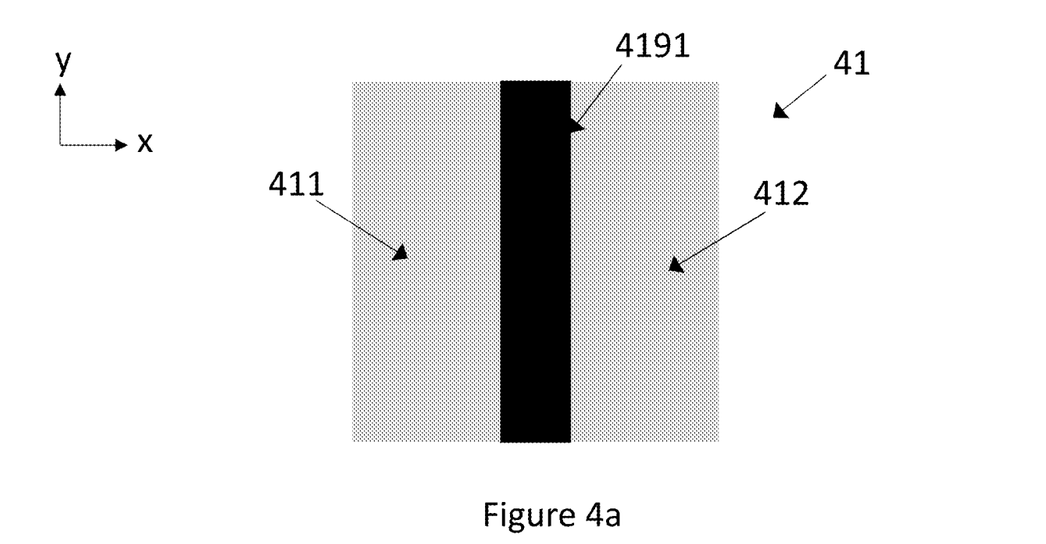
FIGS. 4a-4e illustrate possible shapes for the rotor isolation region.

FIG. 4*a* illustrates the simplest shape, where reference numbers 41, 411 and 412 correspond to reference numbers 11, 111 and 112, respectively in FIG. 1*a*, and reference numbers 4191-4195 all correspond to reference number 119 in FIG. 1*a*.

The simplest shape is illustrated in the xy-plane in FIG. 4*a*, where the rotor isolation region 4191 simply forms a line across the rotor, dividing the rotor into two rotor regions. This geometry may be sufficient if the adhesion between the insulating material and the device wafer is sufficiently strong to keep the two rotor regions firmly attached to each other. However, the rotor may be prone to break from external shocks if the adhesion is weaker. Alternative geometries, where the boundary between the rotor regions and the isolation region obtains more surface area, are in most cases likely to be stronger.

Figure 4B:
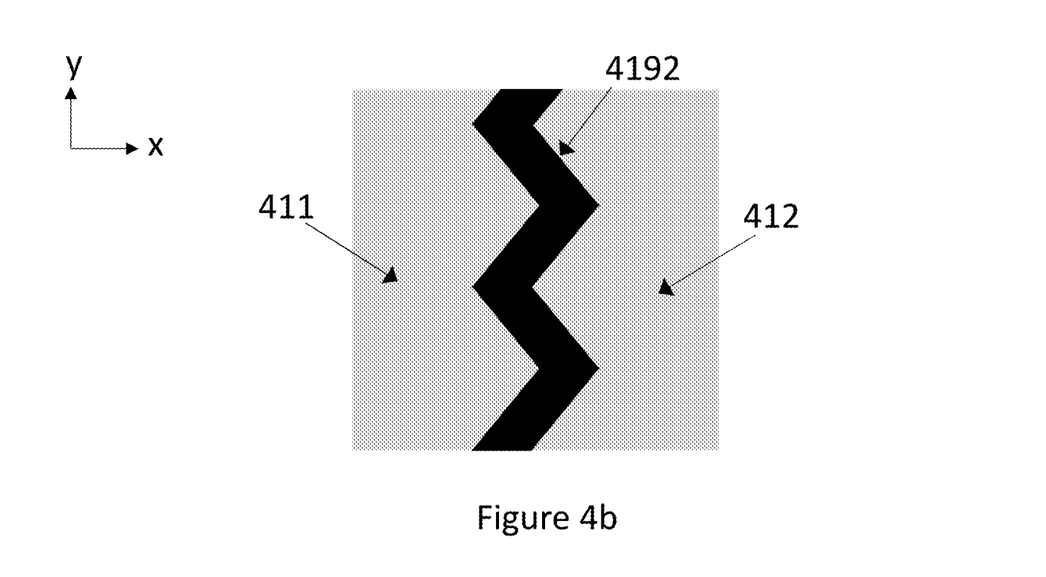
Figure 4C:
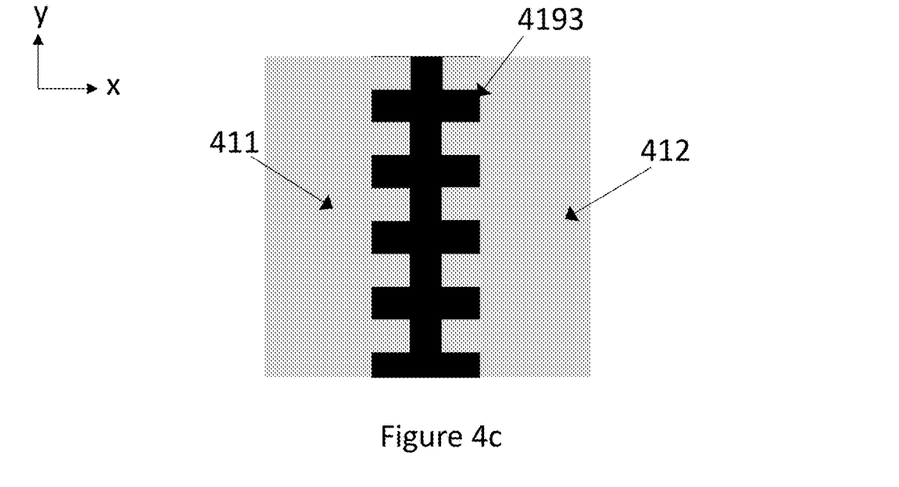
Figure 4D:
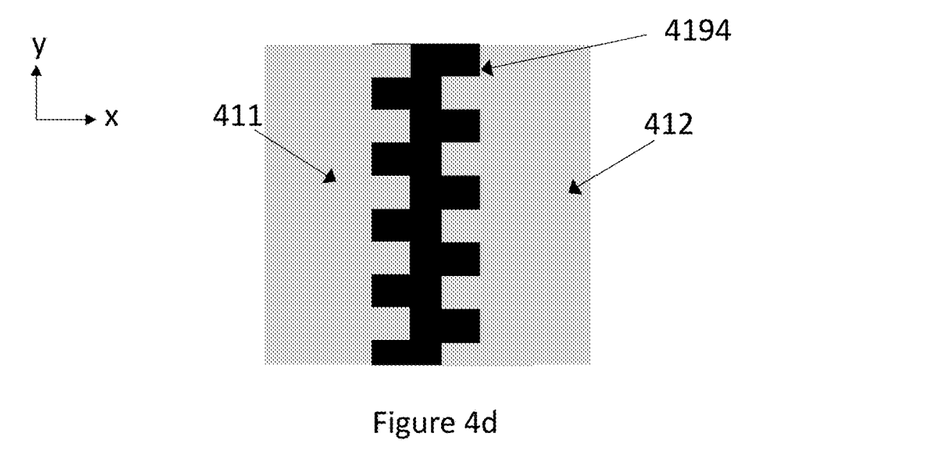
Figure 4E:
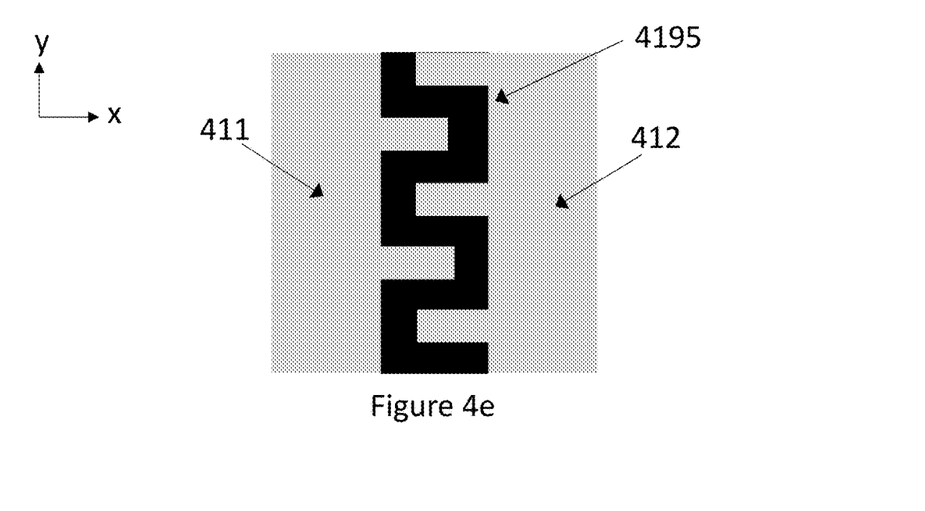

FIG. 4*b* illustrates a rotor isolation region 4192 with a jagged shape comprising several linear segments in series, where each segment is tilted in the xy-plane in relation to the preceding segment. FIG. 4*c* illustrates a rotor isolation region 4193 with a step pattern comprising alternating narrow segments and broad segments in series, so that the isolation region forms a middle line with periodically arranged protrusions to both left and right. FIG. 4*d* illustrates a rotor isolation region 4194 with a step pattern comprising alternating segments of equal width, placed to the left and right of each other and order in series, so that the isolation region comprises a middle line and alternating protrusions to the left and right. Finally, FIG. 4e illustrates a rotor isolation region 4195 with a meander pattern, where the isolation region comprises a meandering line.

The Rotor Stopper Region

Stopper structures are used to prevent undesired, short-circuiting or otherwise disturbing physical contact between a rotor and the surrounding fixed structures. Such contact may occur especially if the MEMS device experiences a sudden external shock which produces a strong acceleration. In prior art solutions where the entire rotor is set to a certain electric potential to facilitate capacitive transduction, stopper structures must be made of a layer of insulating material. But although such a layer prevents short-circuiting, it is often susceptible to become electrically charged when it makes contact with an adjacent stator. This can also create a disturbance in the capacitive transducers formed in the rotor.

When the rotor is divided into electrically isolated regions that can be set to different electric potentials, one region of the rotor can be dedicated for stopping purposes. This designated stopper region can for example be set to the same electric potential as the adjacent stator structure, so that physical contact between the stator and the stopper region of the rotor does not short-circuit the other regions of the rotor. If a separate stopping layer is needed to ensure that the stopping gap is narrower than the measurement gap, then that stopping layer can be a conductive material to ensure that no charge accumulation occurs.

When the stator measurement region is aligned with the rotor measurement region, it may be separated from the rotor measurement region by a measurement gap. The stator stopper region is at least partly aligned with the rotor stopper region across the stopper gap. The stator stopper region may be separated from the rotor stopper region by a stopper gap which is smaller than the measurement gap. The stator stopper region and the rotor stopper region may be set to the same electric potential.

Figure 5:
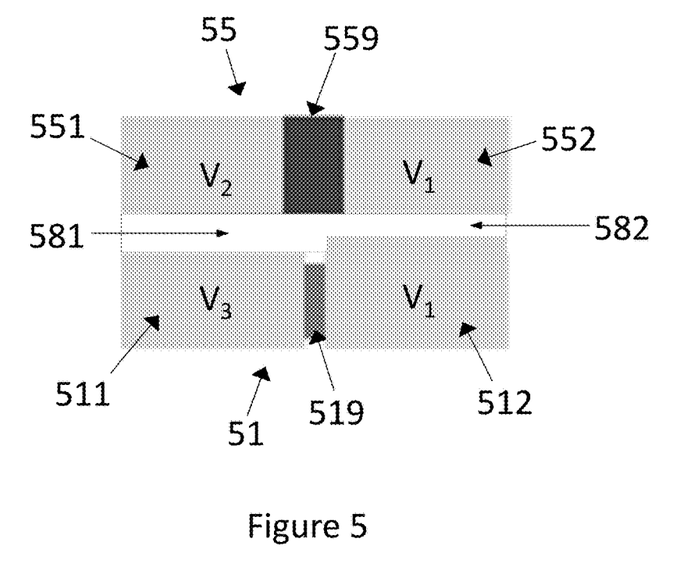
FIG. 5 illustrates a MEMS device with a measurement capacitor and a stopper structure.

FIG. 5 illustrates a MEMS device with a measurement capacitor and a stopper structure. A fixed stator 55 comprises a stator measurement region 551 and a stator stopper region 552, prepared in the device wafer with an insulating stator isolation region 559 in between. The stator 55 has for illustrative purposes the same width as the rotor 51, but it may in practice extend beyond the dimensions of the rotor.

The stator illustrated in FIG. 5 is assumed to at least moderately conductive, so that regions 551 and 552 have to electrically separated by an isolation region which extends through the stator. This would be the case for example if the stator is formed in a silicon body, for example in the fixed part of the device wafer which surrounds the rotor. If the stator is an insulating body, then it doesn't necessarily have to comprise a stator isolation region which is integrated in the stator as in FIG. 5. The stator measurement region 551 and the stator stopper region 552 could in that case be formed simply by conductive electrodes on the stator surface. This option has not been separately illustrated.

The rotor comprises a rotor measurement region 511 and a rotor stopper region 512, mechanically connected by an insulating rotor isolation region 519. The illustrated plane may be either the xy-plane or the xz-plane.

The stator measurement region 551 and the rotor measurement region 511 together form a capacitive transducer. A measurement gap 581 is formed between the rotor measurement region 511 and the stator measurement region 551. The rotor measurement region 511 is set to a potential $V_3$ and the stator measurement region 551 is set to a potential $V_2$, which differs from $V_3$.

The stator stopper region 552 and the rotor stopper region 512 together form a stopper region. A stopper gap 582 is formed between the rotor stopper region 512 and the stator stopper region 552. The rotor stopper region 512 and the stator stopper region 552 are set to the same potential $V_1$. This potential may or may not be equal to either $V_2$ or $V_3$. The rotor will not be short-circuited or charged when the stator stopper region 552 comes into contact with the rotor stopper region 512. The rotor stopper region 512 and the stator stopper region 552 may also in some stopper applications be set to different electric potentials.

The rotor stopper region 512 protrudes further into the gap than the rotor measurement region 511 does, so that the stopper gap 582 becomes smaller than the measurement gap 581. As the rotor moves towards the stator, the rotor stopper region 512 will come into contact with the stator stopper region 552 before there is any contact across the measurement gap. The measurement will not be disrupted by contact across the stopper gap. Stopper designs may in practice be much more complicated than the one illustrated in FIG. 5, but the same principles may be utilized.

Figure 6:
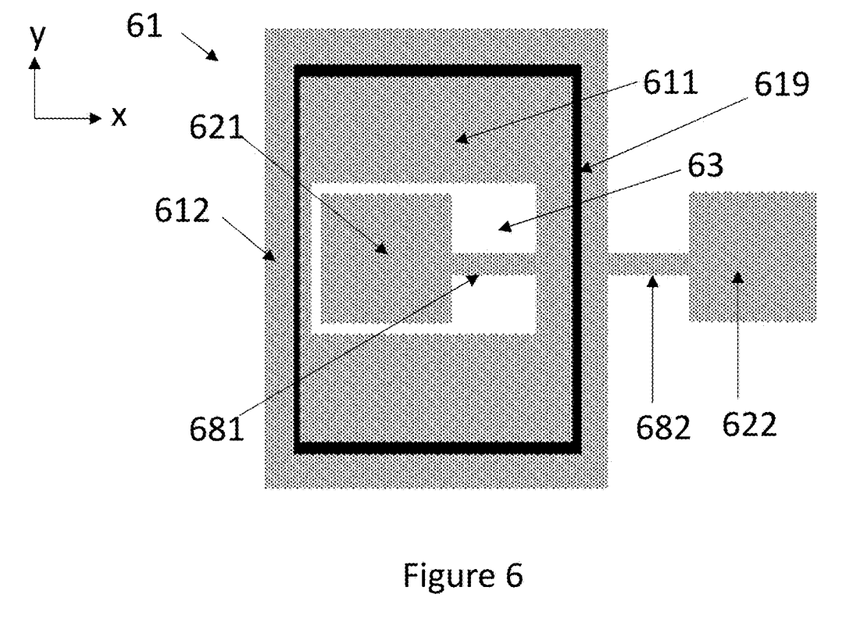
FIG. 6 illustrates an alternative rotor design.

The rotor isolation region does not necessarily have to cross the rotor as in FIGS. 4a-4e. FIG. 6 illustrates an alternative rotor design in the xy-plane. Reference numbers 61, 611-612, 68 and 619 correspond to reference numbers 11, 111-112, 18 and 119 in FIGS. 1a and 1b. The rotor has in this case been anchored to a fixed structure with a central stator 621 which protrudes in the z-direction to a central opening 63 in the rotor 61. The first rotor isolation region 619 surrounds both the rotor measurement region 611 and the central stator 621. The rotor measurement region 611 may be set to a given electric potential via the central stator 621 and a central suspender 681 which is connected to the central stator 621. The rotor stopper region 612 in turn surrounds the first rotor isolation region 619. The rotor stopper region 612 may be attached with an outer suspender 682 to an outer stator 622 and set to a given electric potential via this outer suspender and outer stator.

The rotor stopper region 612 may thereby form an electrically shielded region around the edges of the rotor. The rotor measurement region 611 may be the region where measurements are conducted. If the shielded region 612 makes inadvertent contact with surrounding structures, the measurements will not be affected.

The stopper structure illustrated in FIG. 5 may be implemented when the rotor is configured to undergo translational motion, and the stopper structure in FIG. 6 may be implemented when the rotor is configured to undergo rotational motion.

The invention claimed is:

1. A microelectromechanical device, comprising:
   a device wafer that defines a horizontal device plane;
   a mobile rotor in the horizontal device plane and which comprises a first rotor measurement region made of silicon and a rotor stopper region made of silicon;
   a fixed stator which is adjacent to the rotor and comprises a first stator measurement region and a stator stopper region;
   wherein the mobile rotor is configured to undergo translational motion toward the fixed stator;
   wherein the rotor stopper region is separated from the stator stopper region by a stopper gap, and wherein the mobile rotor also comprises a vertical first rotor isolation region in a vertical direction, wherein the vertical direction is perpendicular to the device plane, and the first rotor isolation region is made of an insulating material which connects the first rotor measurement region mechanically to the rotor stopper region and isolates the first rotor measurement region electrically from the rotor stopper region, and wherein the rotor stopper region and the stator stopper region are set to the same potential.

2. The microelectromechanical device according to claim 1, wherein the mobile rotor further comprises a second rotor measurement region comprising silicon and a second rotor isolation region comprising an insulating material, wherein the second rotor measurement region is mechanically connected to the first rotor measurement region or to the rotor stopper region by the second rotor isolation region, and wherein the second rotor isolation region isolates the second rotor measurement region electrically from the first rotor measurement region and the rotor stopper region.

* * * * *